(12) United States Patent
Wakayama et al.

(10) Patent No.: US 8,114,520 B2
(45) Date of Patent: *Feb. 14, 2012

(54) LASER DICING SHEET AND PROCESS FOR PRODUCING CHIP BODY

(75) Inventors: Yoji Wakayama, Tokyo (JP); Yosuke Sato, Tokyo (JP); Naoki Taya, Tokyo (JP)

(73) Assignee: LINTEC Corporation, Tokyo (JP)

( * ) Notice: Subject to any disclaimer, the term of this patent is extended or adjusted under 35 U.S.C. 154(b) by 519 days.

This patent is subject to a terminal disclaimer.

(21) Appl. No.: 11/949,350

(22) Filed: Dec. 3, 2007

(65) Prior Publication Data

US 2008/0190904 A1    Aug. 14, 2008

Related U.S. Application Data

(63) Continuation-in-part of application No. 11/871,154, filed on Oct. 11, 2007, now abandoned.

(30) Foreign Application Priority Data

Dec. 5, 2006  (JP) .................................. 2006-328609
Mar. 23, 2007  (JP) .................................. 2007-077906

(51) Int. Cl.
*B32B 27/40* (2006.01)
*B23K 26/00* (2006.01)
*C08G 18/08* (2006.01)

(52) U.S. Cl. ........... 428/423.1; 219/121.71; 219/121.72; 528/49

(58) Field of Classification Search .............. 219/121.71, 219/121.72; 528/49; 428/423.1
See application file for complete search history.

(56) References Cited

U.S. PATENT DOCUMENTS

| | | | |
|---|---|---|---|
| 3,558,564 A | 1/1971 | Vasta | |
| 4,555,535 A | 11/1985 | Bednarek et al. | |
| 6,139,953 A * | 10/2000 | Nagamoto et al. | 428/343 |
| 6,156,423 A * | 12/2000 | Nagamoto et al. | 428/345 |
| 7,351,645 B2 * | 4/2008 | Ohashi et al. | 438/465 |
| 2002/0091173 A1 | 7/2002 | Hashimoto et al. | |
| 2005/0186709 A1 | 8/2005 | Okawa | |
| 2005/0208296 A1 | 9/2005 | Saiki et al. | |
| 2005/0269717 A1 * | 12/2005 | Ohashi et al. | 257/783 |
| 2005/0288457 A1 | 12/2005 | Liu et al. | |

(Continued)

FOREIGN PATENT DOCUMENTS

JP        60-196956        10/1985

(Continued)

OTHER PUBLICATIONS

CRC Handbook of Chemistry and Physics, 82nd edition, David R. Lide editor in chief, Washington, DC 2001-2002, pp. 13-1 to 13-4.

(Continued)

*Primary Examiner* — Thao T. Tran
(74) *Attorney, Agent, or Firm* — Hahn & Voight PLLC; Roger C. Hahn (57) ABSTRACT

An object of the present invention is to provide a laser dicing sheet which is capable of preventing cutting of dicing sheet by laser beam, damage of the chuck table and fusion of the dicing sheet to the chuck table.
A laser dicing sheet according to the present invention comprising a base material comprising a polyurethane acrylate; and an adhesive layer formed on one surface thereof.

18 Claims, 1 Drawing Sheet

U.S. PATENT DOCUMENTS

2006/0157191 A1     7/2006   Matsuo
2008/0220253 A1     9/2008   Ohashi et al.

FOREIGN PATENT DOCUMENTS

| | | |
|---|---|---|
| JP | 60-223139 | 11/1985 |
| JP | 05-077284 | 3/1993 |
| JP | 06-101455 | 4/1994 |
| JP | 2001-207140 | 7/2001 |
| JP | 2002-141306 | 5/2002 |
| JP | 2002-343747 | 11/2002 |
| JP | 2006-093368 | 4/2006 |
| JP | 2006-245487 | 9/2006 |

OTHER PUBLICATIONS

Stefan Opera, "Synthesis and Characterization of Polyurethane Urea Acrylates: Effects of the Hard Segments Structure", May 11, 2007, Journal of Applied Polymer Science, vol. 105, 2509-2515.

Yaobin et al., "Synthesis of Polyurethane Acrylate and Application to Ultraviolet-Curable Pressure-Sensitive Adhesive", Dec. 1, 2006, Polymer-Plastic Technology and Engineering, vol. 45, pp. 495-502.

* cited by examiner

[Fig. 1]

LASER DICING SHEET AND PROCESS FOR PRODUCING CHIP BODY

FIELD OF THE INVENTION

The present invention relates to a laser dicing sheet suitably used for fixing a work so as to make into chips by dicing with laser beam and a manufacturing method for chip body with suitably using the laser dicing sheet.

DESCRIPTION OF THE RELATED ART

In recent years, since there is a case that a work is difficult to cut by a blade dicing, a laser dicing is particularly attracted which is capable of cutting the work by the laser dicing. An example of a laser dicing sheet used for the laser dicing is disclosed by the applicant (Patent Document 1).

In the laser dicing, a work fixed on a dicing sheet is cut by scanning the laser beam. In this case, a focal point of the laser beam moves as following, namely, the focal point is accelerated from a surface of the dicing sheet wherein the work is not attached (an outer edge portion of the work), scanning on a surface of the work at constant speed, the focal point is decelerated at the opposite outer edge portion of the work, then the focal point stops. After that, a movement direction is turned and the focal point of the laser beam is accelerated, scanning on the work surface, the laser beam is again decelerated and stops and turned.

Therefore, at the time of accelerating and decelerating speeds when moving the laser beam focal point, the laser beam is directly irradiated on end portions of the dicing sheet wherein the work is not attached. There is a problem that, at this time, the laser beam transmits through the dicing sheet and a chuck table is damaged. Further, there is a problem that a surface of the dicing sheet, which contacts with the chuck table heated by the laser beam, is melting and is fused with the chuck table.

In order to eliminate these problems, a distance between the work and a surface of the chuck table is lengthened by using a dicing sheet having large thickness (Patent Document 2). In this method, a thickness of the dicing sheet is maintained by making bilayer base structure including an expandable film and a protection film. Because of using a thick base material at the time of laser dicing, the laser beam reached to the chuck table is not focused, therefore, the chuck table is not damaged since an energetic density is low. Further the above mentioned fusing problem is not occurred. After finishing the laser dicing, expanding and picking up chips have been conducted after peeling the protection film which composes the base material. However, after the laser dicing, it is necessary to peel one of the structure layers of the base material which causes complicated process. Also, the expanding is sometimes impossible because the expanding film is cut by the laser beam sometime.

Also, Patent Document 3 discloses a dicing sheet comprising an adhesive layer on a base material obtained from film forming and curing curable resin such as urethane acrylate oligomer and the like. However, in this Patent Document 3, it is intended to apply the blade dicing and specific problems of the laser dicing as mentioned above are not recognized.

It is expected that film damage is relatively minor even though the laser beams is directly irradiated, because a crosslink density of a film obtained from film forming and curing the urethane acrylate oligomer is high. Also, because an expanding ability is favorable, it is easy to expand the laser dicing sheet after the dicing to thereby spread the space between chips. Therefore, it should be studied to use polyurethane acrylate film as a base material stated above.

However, although the film described in Patent Document 3 excelled in expanding ability, the expanded film has such character that it is hard to return its original shape as being elongated. Namely, in the case of using such the film as a base material of the dicing sheet, there is following concern.

Normally, after expanding process and picking up chips, the dicing sheet adhered on a ring frame is stowed in a recovery cassette and recovered. After recovering, removing dicing sheet from the ring frame, the ring frame is reused via cleaning process and the like. Since the dicing sheet is elongated by expanding, the dicing sheet is sagging from the ring frame. In this status, the sagging dicing sheet cannot be stowed to the recovery cassette smoothly, because the dicing sheet contacts other recovered ring frame and sheet.

According to the above results, a dicing sheet using a film described in Patent Document 3 has not been realized still, inevitably, there is no utilization as a laser dicing sheet.

[Patent Document 1] Japanese Patent Application Laying Open No. 2002-343747

[Patent Document 2] Japanese Patent Application Laying Open No. 2006-245487

[Patent Document 3] Japanese Patent Application Laying Open No. 2002-141306

DISCLOSURE OF THE INVENTION

Problems to be Solved by the Invention

The present invention attempts to solve the problems associated with the above mentioned conventional art. Namely, an object of the present invention is to provide a laser dicing sheet which is capable of preventing cutting of dicing sheet by laser beam, damage of the chuck table and fusion of the dicing sheet to the chuck table. Another object of the present invention is to provide a manufacturing method for chip body by using laser dicing method wherein the laser dicing sheet is used. Further, the present invention aims to improve shape-restoring ability after expanding of the base material using polyurethane acrylate film which is expected to have excellent properties in the laser dicing.

Means for Solving the Problem

Gist of the present invention aims for solving these problems is as follows;

(1) A laser dicing sheet comprising:
a base material comprising a polyurethane acrylate; and
an adhesive layer formed on one face thereof.

(2) The laser dicing sheet as set forth in (1), wherein the polyurethane acrylate which constitutes the base material is a cured product obtained by irradiating energy beam to a mixture including an energy beam curable urethane acrylate oligomer and an energy beam curable monomer.

(3) The laser dicing sheet as set forth in (2), wherein the energy beam curable urethane acrylate oligomer is a polyether type urethane acrylate oligomer.

(4) The laser dicing sheet as set forth in (3), wherein an ether bonding portion of the polyether type urethane acrylate oligomer is an alkyleneoxy group (—(—R—O-)n-: wherein R is alkylene group, n is an integer of 2 to 200).

(5) The laser dicing sheet as set forth in (4), wherein the alkylene group R of the alkyleneoxy group (—(—R—O-)n-) is alkylene group having 1 to 6 carbon atoms.

(6) The laser dicing sheet as set forth in (5), wherein the alkylene group R of the alkyleneoxy group (—(—R—O-)n-) is ethylene, propylene, butylene or tetramethylene.

(7) The laser dicing sheet as set forth in (1), wherein the polyurethane acrylate which constitutes the base material includes an energy beam curable urethane acrylate oligomer unit of 30 to 70% by weight to 100% by weight of said polyurethane acrylate, said energy beam curable urethane acrylate oligomer comprises an ethyleneoxy group of 35 to 95% by weight as a constituent unit to 100% by weight of the energy beam curable urethane acrylate oligomer.

(8) The laser dicing sheet as set forth in (7), wherein the deformation restoring ratio after 50% expansion of said base material is 80 to 100%.

(9) Method for manufacturing a chip body comprising steps of;
adhering a work on the adhesive layer of the laser dicing sheet as set forth in any one of (1) to (6);
dicing the work into individual chips by laser beam.

(10) Method for manufacturing a chip body comprising steps of;
adhering the work on the adhesive layer of the laser dicing sheet as set forth in any one of (7) or (8);
dicing the work into individual chips by laser beam,
expanding the laser dicing sheet to thereby spread the space between the chips; and
picking up the chips.

Effects of Invention

In the present invention, because using polyurethane acrylate film as the most upper layer of a base material, a received damages is small and not be cut fully, even though laser beam is irradiated to the base material. Also, the base material is not damaged and an amount of light transmitted through the base material and reached to the chuck table is decreased. As a result, in the laser dicing, cutting of a laser dicing sheet, damage of the chuck table and fusion of the dicing sheet to the chuck table are prevented which cause manufacturing processes for the chip body by laser dicing can be operated smoothly. Also, by using a polyurethane acrylate film having predetermined proportion of ethyleneoxy group as a base material in the present invention, shape-restoring ability after expanding the sheet is improved and recovering the ring frame can be operated smoothly.

Best Mode for Carrying the Invention

Hereinafter, the present invention will be explained specifically. A dicing sheet of the present invention is composed of a base material, and an adhesive layer formed thereon.

As the base material, a resin film whose main constituent is polyurethane acrylate is used. As the polyurethane acrylate film, it is preferable a cured product obtained by irradiating energy beam to a mixture including an energy beam curable urethane acrylate oligomer and an energy beam curable monomer after film forming.

An energy beam curable urethane acrylate oligomer is obtained by e.g., reacting (meth)acrylate having hydroxyl group with terminal isocyanate urethane prepolymer obtained by reacting polyol compound such as a polyester type or polyether type with polyvalent isocyanate compound. Also, an energy beam curable urethane acrylate oligomer can be obtained by reacting polyol compound with (meth)acrylate having isocyanate group.

Although the polyol compounds may be any of alkylene diol, polyether type polyol, polyester type polyol or polycarbonate type polyol, more preferable effects is obtained by using polyether type polyol. Also, if it is the polyol, it is not particularly limited and it may be difunctional diol, trifunctional triol, however, in view of availability, general versatility, reactivity and the like, using diol is particularly preferable. Therefore, polyether type diol is preferably used.

The polyether type diol is generally shown as HO—(—R—O-)n-H. Here, R is bivalent hydrocarbon group, preferably, alkylene group, further preferably alkylene group having 1 to 6 carbon atoms, particularly preferably alkylene group having 2 or 3 carbon atoms. Also, in the alkylene group having 1 to 6 carbon atoms, preferred is ethylene, propylene, butylene or tetramethylene, particularly preferably ethylene or propylene. Also, n is preferably 2 to 200, particularly preferably 10 to 100. Therefore, as the polyether type diol which is particularly preferable, polyethylene glycol, polypropylene glycol, polybutylene glycol, polytetramethylene glycol are exemplified and as the particularly preferable polyether type diol, polyethylene glycol, polypropylene glycol are exemplified.

The polyether type diol produces the terminal isocyanate urethane prepolymer by reacting with polyvalent isocyanate compound to introduce ether bonding portion (—(—R—O-)n-). Such the ether bonding portion may be a constitution to be induced by ring-opening reaction of cyclic ether such as ethylene oxide, propylene oxide, tetrahydrofuran and the like.

As the polyvalent isocyanate compound, for example, 4,4'-dicyclohexyl methane diisocyanate, isophorone diisocyanate, 2,4-tolylene diisocyanate, 2,6-tolylene diisocyanate, 1,3-xylylene diisocyanate, 1,4-xylylene diisocyanate, diphenylmethane-4,4'-diisocyanate are used and particularly preferably, 4,4'-dicyclohexyl methane diisocyanate, isophorone diisocyanate are used.

Then, urethane acrylate oligomer can be obtained by reacting terminal isocyanate urethane prepolymer and hydroxyl-containing (meth)acrylate. As the hydroxyl-containing (meth)acrylate, for example, 2-hydroxyethyl acrylate or 2-hydroxyethyl methacrylate, 2-hydroxypropyl acrylate, 2-hydroxypropyl methacrylate, 2-hydroxybutyl acrylate, 2-hydroxybutyl methacrylate, polyethylene glycol acrylate and polyethylene glycol methacrylate are used, particularly, 2-hydroxyethyl acrylate or 2-hydroxyethyl methacrylate are used.

The obtainable urethane acrylate oligomer is shown by the general formula: Z—(Y—(X—Y)m)-Z (here X is a constituent unit derived from polyether type diol, Y is a constituent unit derived from diisocyanate, Z is a constituent unit derived from hydroxyl-containing (meth)acrylate). In the above general formula, m is preferably selected as being 1 to 200, further preferably selected as being 1 to 50.

As above, the urethane acrylate oligomer can be obtained by reacting the polyol compound with the (meth)acrylate having isocyanate group. The polyol compound is similar to the above mentioned, and 2-acryloyloxyethylisocyanate or 2-methacryloyloxyethylisocyanate are used as the (meth)acrylate having isocyanate group, the 2-methacryloyloxyethylisocyanate is particularly used.

The obtainable urethane acrylate oligomer is shown by the general formula: W—X—W (here X is a constituent unit derived from polyether type diol, W is a constituent unit derived from (meth)acrylate having isocyanate group.

The obtainable urethane acrylate oligomer includes photo polymerizable double-bond in its molecule, and has such properties to be polymerized and cured by energy beam, to thereby form film.

A weight-average molecular weight of the urethane acrylate oligomer preferably used in the present invention is within a range of 1000-50000, more preferably within a range of 2000-40000. The above urethane acrylate oligomer can be used singly or in combination of two or more. It is often difficult to obtain a film only from the above urethane acrylate oligomer. Thus, films are generally obtained by diluting with an energy beam curable monomer, conducting a film formation, and curing the film. The energy beam curable monomer includes energy beam polymerizable double bond in its molecule, particularly in the present invention, acryl ester compound having relatively bulky group is preferably used.

As a specific example of energy beam curable monomer to be used for diluting such the urethane acrylate oligomer, it is exemplified alicyclic compound such as isobornyl (meth)acrylate, dicyclopentenyl (meth)acrylate, dicyclopentanyl (meth)acrylate, dicyclopentenyloxy (meth)acrylate, cyclohexyl (meth)acrylate, adamantane (meth)acrylate, aromatic compound such as phenyl hydroxypropyl acrylate, benzyl acrylate, phenol ethylene oxide modified acrylate or heterocyclic compound such as tetrahydrofurfuryl (meth)acrylate, morpholine acrylate, N-vinyl pyrolidone or N-vinyl caprolactam. Also, polyfunctional (meth)acrylate may be used, if necessary. Such the energy beam curable monomer can be used singly or in combination of two or more.

The above energy beam curable monomer are used, preferably, in the proportion of 5 to 900 parts by weight, further preferably 10 to 500 parts by weight, particularly preferably 30 to 200 parts by weight to 100 parts by weight of the urethane acrylate oligomer.

The polyurethane acrylate film which constitutes a base material is obtained by film forming and curing a composition including urethane acrylate oligomer and the energy beam curable monomer. In this case, by mixing a photo polymerization initiator to the composition, polymerization curing time by the energy beam and energy irradiance dose can be reduced. The photo polymerization initiator can be a photoinitiator such as benzoin compound, acetophenone compound, acylphosphinoxide compound, titanocene compound, thioxanthone compound, peroxide compound and the like, and photosensitizer such as amine, quinone and the like. Specifically, 1-hydroxycyclohexylphenylketone, 2-hydroxy-2-methyl-1-phenylpropane-1-on, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, β-chloroanthraquinone and the like are exemplified.

The photo polymerization initiator is preferably added in an amount of 0.05 to 15 parts by weight, further preferably 0.1 to 10 parts by weight, particularly preferably 0.3 to 5 parts by weight to a sum of 100 parts by weight of the urethane acrylate oligomer and energy beam curing monomer.

Also, in the above composition, inorganic filler such as calcium carbonate, silica, mica and metallic filler such as iron, lead and the like may be added to the composition. Further, in addition to the above components, colorants such as pigments and dyes may be added to the base material.

As a film forming method, a flow casting method (casting film forming) is preferably adapted. Specifically, film forming is conducted that after casting liquid composition (before curing resin, solution of resin and the like) on for example, process sheet with thin film shape, then, energy irradiating such as ultra-violet ray, electron beam and the like to the liquid composition by polymerization curing for film forming, thereby, the base material can be manufactured. According to the method, stress to the resin at time of film forming is small and a forming fish eye is small. Further, uniformity of film thickness is high and thickness accuracy is within a range of 2% in normally.

The above base material composed of the polyurethane acrylate film, a received damages is small and not be cut, even though laser beam is irradiated to the base material. Also, the base material is not damaged and an amount of light transmitted through the base material and reached to the chuck table is decreased.

The above mentioned polyurethane acrylate film has advantage points of high resistance ability to the laser beam and excelled in expanding ability. However, there is a case that the polyurethane acrylate film is hard to restoring with maintaining an expanding status. Namely, in the case of using the film as a base material of the dicing sheet, after expanding process, there is a risk that stowing to the recovery cassette cannot be operated smoothly because the dicing sheet becomes sagging after picking up chips.

Therefore, in the case of applying the laser dicing sheet of the present invention particularly to a process having expanding steps, it is desirable that the base material is composed of a polyurethane acrylate film having shape-restoring ability.

A preferable polyurethane acrylate to form the base material having shape-restoring ability comprises 30 to 70% by weight of a urethane acrylate oligomer unit which is a main component, preferably 40 to 60% by weight to 100% by weight of the polyurethane acrylate in a constituent ratio.

Also, the urethane acrylate oligomer comprises 35 to 95% by weight of the ethyleneoxy group, preferably 65 to 90% by weight to 100% by weight of the oligomer in a constituent ratio.

Also, the polyurethane acrylate comprises 10 to 67% by weight of the ethyleneoxy group as a constituent unit, preferably 26 to 54% by weight to 100% by weight of the polyurethane acrylate in a constituent ratio.

Further, alkyleneoxy group other than the ethyleneoxy group may be included in the polyurethane acrylate and the urethane acrylate oligomer. In a preferred aspect, it is sufficient to include the predetermined amount of the ethyleneoxy group and content amount of the other alkyleneoxy group is not particularly limited.

The polyurethane acrylate comprises a predetermined amount of the urethane acrylate oligomer unit and as far as the urethane acrylate oligomer unit comprising a predetermined amount of the alkyleneoxy group (ethyleneoxy group), it is not particularly limited structure, composition and manufacturing method thereof, it can be obtained by the flow casting method as mentioned above.

A constituent ratio of the alkyleneoxy group (including the ethyleneoxy group) in the urethane acrylate oligomer is calculated from raw material composition, for example, it is determined by a total weight of the polyether type diol, polyvalent isocyanate compound, hydroxyl-containing (meth)acrylate as ray materials and a weight of the alkyleneoxy group included in the polyether type diol. Also, a constituent ratio of the urethane acrylate oligomer in the polyurethane acrylate is determined by a total amount of urethane acrylate oligomer and energy beam curable monomer as raw materials and a weight of the urethane acrylate oligomer. Therefore, a constituent ratio of the alkyleneoxy group in the polyurethane acrylate is calculated from a weight of the alkyleneoxy group included in the polyether type diol to whole weight of reactants, too. Also, it is possible to determine quantity directly, according to analyzing the obtained polyurethane acrylate film by pyrolysis gas chromatography and the like.

A reacting ratio of the urethane acrylate oligomer and the energy beam curable monomer may a constituent ratio of the urethane acrylate oligomer unit in the objective polyurethane acrylate composition, also a constituent ratio of the ethyleneoxy group in the obtainable polyurethane acrylate may be within said range. In general, the above mentioned energy beam curable monomer is used in a ratio of, preferably 43 to 233% by weight, further preferably 60 to 160% by weight to 100% by weight of the urethane acrylate oligomer.

Note that, additives such as filler and the like are not included when calculating a constituent ratio of the urethane acrylate oligomer and the ethyleneoxy group, the constituent ratio of the urethane acrylate oligomer and the ethyleneoxy group is determined on the basis of a weight of the polyurethane acrylate as a resin component to constitute a base material.

A polyurethane acrylate film having predetermined ethyleneoxy group has shape-restoring ability even it is a single layer. A conventionally developed polyurethane acrylate film has high stress relaxation ability, and its shape is not restored when expanded. Contrary to this, the polyurethane acrylate film having predetermined ratio ethyleneoxy group has a shape-restoring ability for being its prior expanded shape after the removing stress, even after expanded.

The shape-restoring ability means that having a certain level of expanding character and including shape-restoring character after expanding, to the shape before expanding. Such character can be shown by a deformation restoring ratio after removing the stress obtained by formula as follows. Here, a deformation restoring ratio is preferably 90 to 100%, further preferably 95 to 100%.

A deformation restoring ratio after removing the stress
$(\%) = (1_e - 1_x)/(1_e - 1_0) \times 100$ $1_0$: an initial length
$1_e$: 50% expanded length
$1_x$: a length after restoring Also, on an upper face of the base material, namely, one a surface side wherein the adhesive layer is formed, corona treatment may be applied or primer layer may be provided by ethylene-vinyl acetate copolymer and the like, in order to increase adhesion with the adhesive layer. Also, a multilayer film having the other film or coating layer on a face opposed to the adhesive layer may be used as the base material. A laser dicing sheet according to the present invention is produced by providing an adhesive layer on the base material as stated above. Note that, in case of constituting the adhesive layer by ultra-violet ray curable adhesive, it is necessary that the structural layer of the base material must be transparent to ultra-violet ray. In a dicing sheet of the present invention, although a thickness of the base material is not particularly limited as means for solving problems of the present invention, preferably 10 to 500 μm, further preferably 30 to 300 μm, particularly preferably 50 to 200 μm, in view of workability and the like.

The adhesive layer can be formed by various conventionally known adhesive. As these kinds of adhesive, although it is not limited, for example, adhesive such as rubber type, acrylic type, silicone type, polyvinyl ether and like are used. Also, an energy irradiating curable type, a heat forming type and an water swelling type adhesive can be used.

As energy beam curable type adhesive (ultra-violet ray curing, electron beam curing), particularly it is preferable to use the ultra-violet ray curing adhesive.

A thickness of the adhesive layer is preferably 1 to 100 μm, further preferably 3 to 80 μm, particularly preferably 5 to 50 μm. Note that a release film may be stacked on the adhesive layer for protecting the adhesive layer prior to use thereof.

The release film is not particularly limited, release treated film by release agent such as silicone, fluorine, long-chain alkyl group contained carbamate to a film composed of resin, such as polyethylene terephthalate, polypropylene, polyethylene and the like, foamed films thereof or a paper such as glassine paper, coating paper, laminated paper and the like may be used.

The method for providing the adhesive layer on the base material may be either of transferring adhesive layer having predetermined thickness formed by coating onto a surface of the release film or directly coating the adhesive on the surface of the base material to thereby forming the adhesive layer.

Next, a manufacturing method for a chip body using the laser dicing sheet of the present invention will be explained.

In the manufacturing method for a chip body of the present invention, adhering a work to the above adhesive layer of the laser dicing sheet of the present invention, scanning a surface of the work by laser beam and obtaining a chip body by cutting the work. Such the laser dicing method itself has been publicly known. In the laser dicing, a focal point of the laser beam moves as mentioned below, namely, a focal point is accelerated from an exposed surface of the dicing sheet wherein the work is not attached (edge portion of the work), scanning on the work surface at a constant speed, the focal point is decelerated at the opposite outer edge portion of the work, then the focal point stops. After that, a movement direction is turned and the focal point of the laser beam is accelerated, scanning on the work surface, the laser beam is again decelerated and stops and turned. Normally, a laser beam scanning is conducted at one to several times per one dicing line.

At the times of accelerating and decelerating of the laser focal point moving, the laser beam is directly irradiated to the edge portion wherein the work is not attached. At this time, the laser beam occasionally cuts the dicing sheet. Also, there are occasionally to raise a problem that the laser beam transmits through the dicing sheet, a chuck table is damaged by the laser beam. Further, there is a problem that a surface of the dicing sheet, which contacts with the chuck table heated by the laser beam, is melting and fused with the chuck table.

However, in the present invention, by using the above mentioned polyurethane acrylate film as a structural layer of the base material of the laser dicing sheet, the above problem is solved. Namely, in the case of using the laser dicing sheet of the present invention, it is confirmed that the base material is hard to receive damage by the laser beam, even if the laser beam is irradiated the dicing sheet directly. Specifically, only a portion of the base material is cut by the laser beam and the base material is not cut fully. Also, the laser beam having high energy does not reach to the chuck table by transmitting through the base material and it is not confirmed the fusing of the laser dicing sheet.

After finishing the laser dicing, in accordance with the necessity, expanding the laser dicing sheet and thereby spread the space between the chips. According to spread the space between the chips, a damage by contacting each chips can be reduced. After that, picking up the chips, and obtaining the chip bodies. Note that, in the case of the adhesive layer is composed of the ultra-violet ray curable adhesive, the ultra-violet ray irradiating is conducted, in response to the necessity, prior to the picking up. The ultra-violet ray curable adhesive is polymerized and cured by irradiating the ultra-violet ray which causes reducing adhesive force, the picking up the chips can smoothly be operated.

After picking up the chips, the dicing sheet adhered on a ring frame is stowed in a recovery cassette and recovered. After recovering, removing dicing sheet from the ring frame, the ring frame is reused via cleaning process and the like. Since the dicing sheet is elongated by expanding, a low shape-restoring capability dicing sheet is sagging from the ring frame. In this status, the sagging dicing sheet cannot be recovered to the recovery cassette smoothly, because the dicing sheet contacts other recovered ring frame and sheet. For example, although the polyurethane acrylate film excels in the expanding capability, lacks of a shape-restoring ability.

However, by using the polyurethane acrylate film having predetermined ratio of the ethyleneoxy group as the base material, sag of the dicing sheet can easily be solved. As a result, recovering the ring frame to the recovery cassette can be smoothly, a productive efficiency of the chip body is progressed.

As a work applicable in the present invention, as far as it can be operated a cut treatment by the laser beam, a material is not limited. For example, various of articles, such as a semiconductor wafer, a glass substrate, a ceramic substrate, an organic material substrate such as FPC and the like or a metallic material such as precision component are exemplified.

A laser is a device generating a light whose wavelength and phase are coherent, a solid-laser such as YAG (fundamental wavelength=1064 nm), ruby (fundamental wavelength=694 nm) or a gas laser such as argon ion laser (fundamental wavelength=1930 nm) and their higher harmonics wave are known. In the present invention, these various lasers can be used. Also, according to the polyurethane acrylate film having predetermined ratio of the ethyleneoxy group, the shape restoring ability can be improved after expanding the sheet, recovering the ring frame can be conducted smoothly.

INDUSTRIAL APPLICABILITY

In the present invention, because the polyurethane acrylate is used as the composition resin of a base material, receiving damage of the base material is small, even though laser beam is irradiated to the base material. Also, an amount of light transmitted through the base material and reached to the chuck table is decreased. As a result, in the laser dicing, damage of the chuck table and fusing of the dicing sheet to the chuck table are prevented which cause manufacturing processes for the chip body by laser dicing can be operated smoothly.

EXAMPLE

Hereinafter, the present invention will be described with by embodiments. However, the present invention is not limited to the embodiments.

Note that, in the following example and comparative example, a following composition is used as an adhesive.

[Adhesive Composition]

30 weight % toluene solution of copolymer produced from 84 parts by weight of butyl acrylate, 10 parts by weight of methyl methacrylate, 1 parts by weight of acrylic acid and 5 parts by weight of 2-hydroxyethyl acrylate (weight-average molecular weight 700,000) was blended with 3 parts by weight of polyvalent isocyanate compound (CORONATE L (produced by Nippon polyurethane Industry Co., Ltd.)) and thus, adhesive composition was obtained.

Also, laser dicing conditions and evaluation methods for dicing results are shown below;

[Laser dicing condition (1)]

| | |
|---|---|
| apparatus: | Nd-YAG Laser |
| chuck table material: | quarts |
| wavelength: | 355 nm (third harmonic wave) |
| output: | 5.5 W |
| cyclic frequency: | 10 kHz |
| pulse duration: | 35 nsec |
| irradiation time: | 2times/1 line |
| cutting speed: | 200 mm/sec |
| defocus amount: | +50 µm from tape surface (focal point on the surface of wafer) |
| wafer material: | silicon |
| wafer thickness: | 50 µm |
| wafer size: | 6 inch |
| chip cut size: | 5 mm square |
| laser scanning distance at outside of wafer: | 5 mm |

[Laser dicing condition (2)]

| | |
|---|---|
| apparatus: | Nd-YAG Laser |
| chuck table material: | quarts |
| wavelength: | 355 nm (third harmonic wave) |
| output: | 8 W |
| cyclic frequency: | 10 kHz |
| pulse duration: | 35 nsec |
| irradiation time: | 8times/1 line |
| cutting speed: | 150 mm/sec |
| defocus amount: | +100 µm from tape surface (focal point on the surface of wafer) |
| wafer material: | silicon |
| wafer thickness: | 100 µm |
| wafer size: | 6 inch |
| chip cut size: | 5 mm square |
| laser scanning distance at outside of wafer: | 5 mm |

[Laser dicing condition (3)]

| | |
|---|---|
| apparatus: | Nd-YAG Laser |
| chuck table material: | quarts |
| wavelength: | 355 nm (third harmonic wave) |
| output: | 5.5 W |
| cyclic frequency: | 10 kHz |
| pulse duration: | 35 nsec |
| irradiation time: | 8times/1 line |
| cutting speed: | 200 mm/sec |
| defocus amount: | +100 µm from tape surface (focal point on the surface of wafer) |
| wafer material: | silicon |
| wafer thickness: | 100 µm |
| wafer size: | 6 inch |
| chip cut size: | 5 mm square |
| laser scanning distance at outside of wafer: | 5 mm |

[Cutting Depth Evaluation]

After the laser dicing, cross-sectional observation is made to the cutting line and a cutting depth from the surface of the sheet including the adhesive layer was measured (the observation site is a portion where the wafer is not adhered and the laser is irradiated directly). Cut out material fully is listed as "cut".

[Damage of Chuck Table]

A table surface was visually observed after the laser dicing and confirmed as to whether damage was made. No damage on the table is listed as "No", and damaged is listed as "Yes".

[Fusing to Chuck Table]

At the time of take out a wafer with the laser dicing sheet from the dicing table after the laser dicing with using a transport mechanism equipped with the laser dicing apparatus, no transporting problem is listed as fusing "No", the case that there is difficulty to transport smoothly by fusing the dicing sheet to the table is listed as fusing "Yes".

[Deformation Restoring Ratio]

A deformation ratio was calculated from a value obtained by conducting a stretching test of a base material under following condition.

A deformation restoring ratio (%)=$(1_e-1_x)/(1_e-1_0)\times 100$ $1_0$: an initial length
$1_e$: 50% expanded length
$1_x$: a length after restoring Specifically, samples of 140 mm length×15 mm width (a thickness is the thickness to be used in the embodiments) is cut out from base materials in the examples/comparative examples, gripping both end of the base material to fix the films to a stretching tester so as to be 100 mm ($1_0$) of measurement interval under an ambience 23° C. and 65% humidity, stretching the film until the measurement interval is being 150 mm ($1_e$) at a speed of 200 mm/min and kept 1 minute. After this, removing from the stretching tester and left at rest during 5 minutes, then, the length of base material ($1_x$) was measured.

[Expanding Performance]

A dicing sheet on which a wafer is not adhered was subjected to expanding under an ambience 23° C. and 65% humidity, at pulling down amount 5 mm by using a die bonder CSP-100VX produced by NEC Machinery Corporation. Expanding available is listed as "good", a device was stopped due to a toughness of base material or the laser dicing sheet dropped from the ring frame is listed as "NG".

[Restoring Availability]

Figure 1:
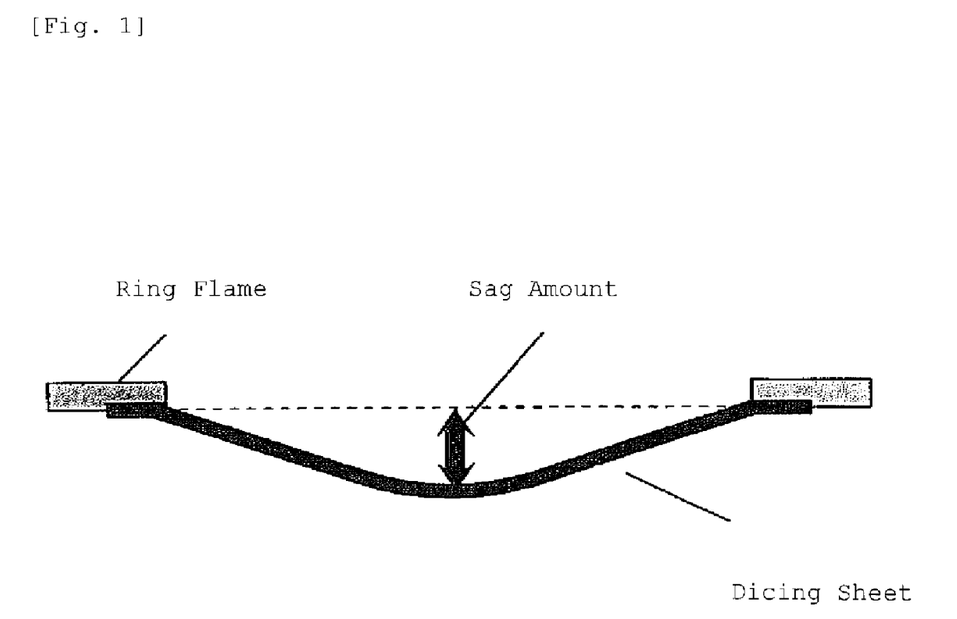
FIG. 1 is a drawing explaining the "sag" amount evaluated in examples.

After kept during 1 minute at expanding state, removed from the device, put into a drier of 70° C. during 1 minute, after returning at room temperature, a maximum distance (herein after referred as "sag amount") between the dicing sheet and a plane defined by a lower surface of the ring frame was measured, as shown in FIG. 1. The sag amount is less than 5 mm is listed as "good", exceeding 5 mm is listed as "NG".

Example 1

2-hydroxyethyl acrylate (2HEA), 4,4'-dicyclohexyl methane diisocyanate ($H_{12}$MDI) and polyester polyol shown by a following formula (Polyol: molecular weight 826) are prepared at molar ratio 2HEA:$H_{12}$MDI:Polyol=2:4:3. Initially, $H_{12}$MDI and polyester polyol are reacted, 2HEA is added to the obtained product so as to obtain urethane acrylate oligomer.

[Chemical Formula]

Then, 50 parts by weight of the urethane acrylate oligomer, 50 parts by weight of an energy beam curable monomer (isobornyl acrylate) and 3 parts by weight of a photoinitiator (IRGACURE184 produced by Ciba Specialty Chemicals) were blended and a film forming coating liquid was obtained.

Resin composition layer was formed by coating the above coating liquid to a silicone release treated polyethylene terephthalate (PET) film (release film; SP-PET3801 produced by Lintec Corporation) by fountain die method as being its thickness is 100 μm. Immediately after coating, laminating a same silicone release treated PET film (release film) on the resin composition layer. Subsequently, the resin composition layer is cured and crosslinked by irradiating energy beam (ultra-violet ray) under a condition 250 mW/cm² of a lighting intensity and 600 m J/cm² of a light illuminance with using a high-pressure mercury lamp and a polyurethane acrylate base material film having 100 μm thickness is obtained.

The release films laminated on both surface were removed prior to transferring an adhesive layer described following.

Aside from this, the adhesive composition (1) is coated and dried (100° C., 1 minute) on the silicone treated release PET film (SP-FET3801 produced by Lintec Corporation) so as to be a dried adhesive layer thickness 10 μm.

The above mentioned adhesive layer is transferred on a base material film wherein a release film is peeled, a laser dicing sheet is obtained.

The laser dicing was conducted under the condition of [Laser dicing condition (1)] with peeling the PET film (SP-PET3801 produced by Lintec Corporation) on the adhesive layer (1) and adhering a silicon wafer having 50 μm thickness. Results are shown in Table 1.

Example 2

2-hydroxyethyl acrylate (2HEA), isophorone diisocyanate (IPDI) and polytetramethyelene glycol (PTMG: weight-average molecular weight 2,000) are prepared at molar ratio 2HEA:IPDI:PTMG=2:5:4. Initially, IPDI and PTMG are reacted, 2HEA is added to the obtained product so as to obtain urethane acrylate oligomer.

Then, 50 parts by weight of the urethane acrylate oligomer, 50 parts by weight of an energy beam curable monomer (isobornyl acrylate) and 0.5 parts by weight of a photoinitiator (DALOCURE1173 produced by Ciba Specialty Chemicals) were blended and a film forming coating liquid was obtained.

Subsequently, a base material film was produced by using the obtained coating liquid, according to the same manner as in the example 1. And providing an adhesive layer according to the same manner, a laser dicing sheet was obtained. Results are shown in Table 1.

Example 3

2-hydroxyethyl acrylate (2HEA), isophorone diisocyanate (IPDI) and polypropylene glycol (PPG: weight-average molecular weight 2,000) are prepared at molar ratio 2HEA:IPDI:PPG=2:5:4. Initially, IPDI and PPG are reacted, 2HEA is added to the obtained product so as to obtain urethane acrylate oligomer.

Then, 50 parts by weight of the urethane acrylate oligomer, 50 parts by weight of an energy beam curable monomer (isobornyl acrylate) and 0.5 parts by weight of a photoinitiator (DALOCURE1173 produced by Ciba Specialty Chemicals) were blended and a film forming coating liquid was obtained.

Subsequently, a base material film was produced by using the obtained coating liquid, according to the same manner as in the example 1. And providing an adhesive layer according to the same manner, a laser dicing sheet was obtained. Results are shown in Table 1.

Example 4

A similar operation as in the above example 3 was conducted except for operating laser dicing under the condition of [Laser dicing condition (2)]. Results are shown in Table 1.

Example 5

2-methacryloyloxyethylisocyanate (MOI), polypropylene glycol (PPG: weight-average molecular weight 2,000) are prepared at molar ratio MOI:PPG=2:1. MOI is added to PPG so as to obtain urethane acrylate oligomer.

Then, 50 parts by weight of the urethane acrylate oligomer, 50 parts by weight of an energy beam curable monomer (isobornyl acrylate) and 0.5 parts by weight of a photoinitiator (DALOCURE1173 produced by Ciba Specialty Chemicals) were blended and a film forming coating liquid was obtained.

Subsequently, a base material film was produced by using the obtained coating liquid, according to the same manner as in the example 1. And providing an adhesive layer according to the same manner, a laser dicing sheet was obtained. Results are shown in Table 1.

Comparative Example 1

A similar operation as in the above example 1 was conducted except for using polyvinylchloride film (including 25 weight % of dioctylphthalate as plasticizing material) having thickness of 100 µm as a base material film. Results are shown in Table 1.

Comparative Example 2

A similar operation as in the above example 1 was conducted except for using ethylene-methacrylic acid copolymer film (methacrylic acid copolymer ratio 9 weight %) having thickness of 100 µm as a base material film. Results are shown in Table 1.

Comparative Example 3

A similar operation as in the above comparative example 2 was conducted except for conducting laser dicing under the condition of [Laser dicing condition (2)]. Results are shown in Table 1.

TABLE 1

|  | Laser dicing condition | Cutting depth (µm) | Damage of chuck table | Fusing to chuck table |
|---|---|---|---|---|
| Example 1 | (1) | 50 | No | No |
| Example 2 | (1) | 40 | No | No |
| Example 3 | (1) | 30 | No | No |
| Example 4 | (2) | 45 | No | No |
| Example 5 | (1) | 45 | No | No |
| Comparative Example 1 | (1) | Cut | Yes | Yes |
| Comparative Example 2 | (1) | 15 | Yes | Yes |
| Comparative Example 3 | (2) | cut | Yes | Yes |

Laser dicing sheets of the examples 1 to 5 are not cut, damage of the chuck table and fusing to the chuck table were not found. Laser dicing sheets of the comparative examples 1 and 3 are cut, damage of the chuck table and fusing to the chuck table were found. Although a laser dicing sheet of the comparative example 2 is not cut, damage by laser beam through a dicing sheet and fusing to the chuck table were found.

Example 6

2-hydroxyethyl acrylate (2HEA), isophorone diisocyanate (IPDI) and polyethylene glycol (PEG: weight-average molecular weight 2,000) are prepared by molar ratio 2HEA:IPDI:PEG=2:7:6. Initially, IPDI and PEG are reacted, 2HEA is added to the obtained product so as to obtain urethane acrylate oligomer.

Then, 50 parts by weight of the urethane acrylate oligomer, 50 parts by weight of an energy radiation curable monomer (isobornyl acrylate) and 0.5 parts by weight of a photoinitiator (DALOCURE1173 produced by Ciba Specialty Chemicals) were blended and a coating liquid for film forming was obtained.

Resin composition layer was formed by coating the above coating liquid to a silicone treated polyethylene terephthalate (PET) release film (SP-PET3801 produced by Lintec Corporation) by fountain die method as being its thickness is 100 µm. Immediately after coating, laminating a same silicone treated release PET film on the resin composition layer. Subsequently, the resin composition layer is cured and crosslinked by irradiating energy radiation (ultra-violet radiation) under a condition 250 mW/cm$^2$ of a lighting intensity and 600 mJ/cm$^2$ of a light illuminance with using a high-pressure mercury lamp and a polyurethane acrylate film having 100 µm thickness is obtained. A constituent ratio of the polyurethane acrylate oligomer in the obtained polyurethane acrylate film, a constituent ratio of the alkyleneoxy group (ethyleneoxy group) in the urethane acrylate oligomer, the alkyleneoxy group (ethyleneoxy group) in the polyurethane acrylate film and a deformation restoring ratio are shown in Table 2.

The release films laminated on both surface were removed prior to transferring an adhesive layer described following.

Aside from this, said adhesive composition is coated and dried (100° C., 1 minute) on the silicone treated release PET film (SP-PET3801 produced by Lintec Corporation) so as to be a dried film thickness 10 µm, and an adhesive layer was formed.

Then, the adhesive layer of the PET film is laminated on one surface of the polyurethane acrylate film wherein a release film is peeled. As the result, a laser dicing sheet having constituting layers of a PET film/an adhesive layer/a polyurethane acrylate film is obtained.

The laser dicing was conducted under the above mentioned condition of [Laser dicing condition (3)] with peeling the PET film (SP-PET3801 produced by Lintec Corporation) on the adhesive layer and adhering a silicon wafer having 100 µm thickness.

Results are shown in Table 3.

Example 7

2-hydroxyethyl acrylate (2HEA), hexahydroxylene diisocyanate (H6XDI) and polyethylene glycol (PEG: weight-average molecular weight 1,000) are prepared by molar ratio 2HEA:H6XDI:PEG=2:5:4. Initially, H6XDI and PEG are reacted, 2HEA is added to the obtained product so as to obtain urethane acrylate oligomer.

A similar operation as in the above example 6 was conducted to produce a polyurethane acrylate film except for preparing a polyurethane acrylate film by using said urethane acrylate oligomer and mixture of 60 parts by weight of the urethane acrylate oligomer, 40 parts by weight of the energy beams curable monomer (isobornyl acrylate), 0.5 parts by weight of the photoinitiator as coating liquid for film forming, and a dicing sheet is obtained. Note that, a constituent ratio of the polyurethane acrylate oligomer in the obtained polyurethane acrylate film, a constituent ratio of the alkyleneoxy group (ethyleneoxy group) in the urethane acrylate oligomer, the alkyleneoxy group (ethyleneoxy group) in the polyurethane acrylate film and a deformation restoring ratio are shown in Table 2. Results of the laser dicing by using similar condition of the example 6 are shown in Table 3.

Example 8

2-hydroxyethyl acrylate (2HEA), dicyclohexyl methane diisocyanate ($H_{12}MDI$) and polyethylene glycol (PEG: weight-average molecular weight 4,000) are prepared by molar ratio 2HEA:$H_{12}$MDI:PEG=2:3:2. Initially, $H_{12}$MDI and PEG are reacted, 2HEA is added to the obtained product so as to obtain urethane acrylate oligomer.

A similar operation as in the above example 6 was conducted to produce a polyurethane acrylate film except for preparing a polyurethane acrylate film by using said urethane acrylate oligomer and mixture of 40 parts by weight of the urethane acrylate oligomer, 60 parts by weight of the energy beams curable monomer (isobornyl acrylate), 0.5 parts by weight of the photoinitiator as coating liquid for film forming, and a dicing sheet is obtained. Note that, a constituent ratio of the polyurethane acrylate oligomer in the obtained polyurethane acrylate film, a constituent ratio of the alkyleneoxy group (ethyleneoxy group) in the urethane acrylate oligomer, the alkyleneoxy group (ethyleneoxy group) in the polyurethane acrylate film and a deformation restoring ratio are shown in Table 2. Results of the laser dicing by using similar condition of the example 6 are shown in Table 3.

Example 9

2-hydroxyethyl acrylate (2HEA), isophorone diisocyanate (IPDI) and polypropylene glycol (PPG: weight-average molecular weight 2,000) are prepared by molar ratio 2HEA:IPDI:PPG=2:5:4. Initially, IPDI and PPG are reacted, 2HEA is added to the obtained product so as to obtain urethane acrylate oligomer.

A similar operation as in the above example 6 was conducted to produce a polyurethane acrylate film except for preparing a polyurethane acrylate film by using said urethane acrylate oligomer, and a dicing sheet is obtained. Note that, a constituent ratio of the polyurethane acrylate oligomer in the obtained polyurethane acrylate film, a constituent ratio of the alkyleneoxy group (ethyleneoxy group) in the urethane acrylate oligomer, the alkyleneoxy group (ethyleneoxy group) in the polyurethane acrylate film and a deformation restoring ratio are shown in Table 2. Results of the laser dicing by using similar condition of the example 6 are shown in Table 3.

Example 10

2-hydroxyethyl acrylate (2HEA), hexahydroxylene diisocyanate (H6XDI) and polyethylene glycol (PEG: weight-average molecular weight 2,000) and polypropylene glycol (PPG: weight-average molecular weight 2,000) are prepared by molar ratio 2HEA:H6XDI:PEG:PPG=2:6:1:4. Initially, H6XDI, PEG and PPG are reacted, 2HEA is added to the obtained product so as to obtain urethane acrylate oligomer.

A similar operation as in the above example 6 was conducted to produce a polyurethane acrylate film except for preparing a polyurethane acrylate film by using said urethane acrylate oligomer, and a dicing sheet is obtained. Note that, a constituent ratio of the polyurethane acrylate oligomer in the obtained polyurethane acrylate film, a constituent ratio of the alkyleneoxy group (ethyleneoxy group) in the urethane acrylate oligomer, the alkyleneoxy group (ethyleneoxy group) in the polyurethane acrylate film and a deformation restoring ratio are shown in Table 2. Results of the laser dicing by using similar condition of the example 6 are shown in Table 3.

Comparative Example 4

A laser dicing sheet was obtained according to a similar operation as in the example 6 except for using the polyethylene film having thickness of 80 μm and deformation restoring ratio of 951 after removing the stress instead of the polyurethane acrylate film. Results of the laser dicing by using similar condition of the example 6 are shown in Table 3.

TABLE 2

| Constituent ratio of urethane acrylate oligomer in polyurethane acrylate (weight percent) | Constituent ratio of alkyleneoxy group in urethane acrylate oligomer (weight percent) | Constituent ratio of ethyleneoxy group in urethane acrylate oligomer (weight percent) | Constituent ratio of alkyleneoxy group in polyurethane acrylate (weight percent) | Constituent ratio of ethyleneoxy group in polyurethane acrylate (weight percent) | Deformation restoring ratio (%) |
|---|---|---|---|---|---|
| 50 | 87.0 | 87.0 | 43.5 | 43.5 | 92 |
| 60 | 78.2 | 78.2 | 46.9 | 46.9 | 91 |
| 40 | 88.7 | 88.7 | 35.5 | 35.5 | 93 |
| 50 | 85.6 | 0 | 42.8 | 0 | 65 |
| 50 | 87.8 | 17.6 | 43.9 | 8.8 | 55 |
| — | — | — | — | — | 95 |

TABLE 3

| | Laser dicing condition | Cutting depth (μm) | Damage of chuck table | Fusing to chuck table | Expanding performance | Restoring availability (sag amount) (mm) |
|---|---|---|---|---|---|---|
| Example 6 | (3) | 45 | No | No | good | 2 (good) |
| Example 7 | (3) | 40 | No | No | good | 3 (good) |
| Example 8 | (3) | 50 | No | No | good | 4 (good) |
| Example 9 | (3) | 40 | No | No | good | 12 (NG) |
| Example 10 | (3) | 45 | No | No | good | 9 (NG) |
| Comparative Example 4 | (3) | 15 | Yes | Yes | good | 1 (good) |

Laser dicing sheets of the examples 6 to 10 are not cut, damage of the chuck table and fusing to the chuck table were not found. Also, the expanding ability and the restoring ability were excellent. However, in the examples 9, 10, the restoring ability is not sufficient. In the laser dicing sheet of the comparative example 4, damage of the chuck table and fusing to the chuck table were found.

The invention claimed is:

1. A laser dicing sheet comprising:
a base material comprising a polyurethane acrylate film which is a cured product obtained by irradiating an energy beam to a mixture including an energy beam curable polyether type urethane acrylate oligomer and an energy beam curable monomer; and
an adhesive layer formed on the polyurethane acrylate film.

2. The laser dicing sheet as set forth in claim 1, wherein an ether bonding portion of the polyether type urethane acrylate oligomer is an alkyleneoxy group (—R—O-)n-: wherein R is alkylene group, n is an integer of 2 to 200.

3. The laser dicing sheet as set forth in claim 2, wherein the alkylene group R of the alkyleneoxy group (—(—R—O-)n-) is alkylene group having 1 to 6 carbon atoms.

4. The laser dicing sheet as set forth in claim 3, wherein the alkylene group R of the alkyleneoxy group (—(—R—O-)n-) is ethylene, propylene, butylene or tetramethylene.

5. A laser dicing sheet comprising:
a base material comprising a polyurethane acrylate film which includes an energy beam curable urethane acrylate oligomer unit of 30 to 70% by weight to 100% by weight of said polyurethane acrylate, said energy beam curable urethane acrylate oligomer comprises an ethyleneoxy group of 35 to 95% by weight as a constituent unit to 100% by weight of the energy beam curable urethane acrylate oligomer; and
an adhesive layer formed on the polyurethane acrylate film.

6. The laser dicing sheet as set forth in claim 5, wherein the deformation restoring ratio after 50% expansion of said base material is 80 to 100%.

7. The laser dicing sheet as set forth in claim 1, wherein a primer layer is provided on the surface of the polyurethane acrylate film, and adhesive layer is formed thereon.

8. The laser dicing sheet as set forth in claim 1, wherein the lacer dicing sheet is used for fixing a work to make into chips by dicing with a laser beam.

9. The laser dicing sheet as set forth in claim 5, wherein the lacer dicing sheet is used for fixing a work to make into chips by dicing with a laser beam.

10. Method for manufacturing a chip body comprising steps of:
adhering a work on an adhesive layer of a laser dicing sheet having a base material comprising a polyurethane acrylate film, which is a cured product obtained by irradiating an energy beam to a mixture including an energy beam curable polyether type urethane acrylate oligomer and an energy beam curable monomer, and the adhesive layer formed on the polyurethane acrylate film; and
dicing the work into individual chips by laser beam.

11. Method for manufacturing a chip body comprising steps of:
adhering a work on an adhesive layer of a laser dicing sheet having a base material comprising a polyurethane acrylate film, which is a cured product obtained by irradiating an energy beam to a mixture including an energy beam curable polyether type urethane acrylate oligomer and an energy beam curable monomer, and the adhesive layer formed on the polyurethane acrylate film;
dicing the work into individual chips by laser beam, expanding the laser dicing sheet to thereby spread the space between the chips; and
picking up the chips.

12. The method for manufacturing a chip body as set forth in claim 10, wherein the polyurethane acrylate which constitutes the base material is a cured product obtained by irradiating energy beam to a mixture including an energy beam curable urethane acrylate oligomer and an energy beam curable monomer.

13. The method of manufacturing a chip body as set forth in claim 12, wherein the energy beam curable urethane acrylate oligomer is a polyether type urethane acrylate oligomer.

14. The method for manufacturing a chip body as set forth in claim 13, wherein an ether bonding portion of the polyether type urethane acrylate oligomer is an alkyleneoxy group (—(R—O-)n-: wherein R is alkylene group, n is an integer of 2 to 200).

15. The method for manufacturing a chip body as set forth in claim 14, wherein the alkylene group R of the alkyleneoxy group (—(—R—O)n-) is alkylene group having 1 to 6 carbon atoms.

16. The method for manufacturing a chip body as set forth in claim 15, wherein the alkylene group R of the alkyleneoxy group (—(—R—O)n-) is ethylene, propylene, butylene, or tetramethylene.

17. The method for manufacturing a chip body as set forth in claim 11, wherein the polyurethane acrylate which constitutes the base material includes an energy beam curable urethane acrylate oligomer unit of 30 to 70% by weight to 100% by weight of said polyurethane acrylate, said energy beam curable urethane acrylate oligomer comprises an ethyleneoxy group of 35 to 95% by weight as a constituent unit to 100% by weight of the energy beam curable urethane acrylate oligomer.

18. The method for manufacturing a chip body as set forth in claim 11, wherein the deformation restoring ratio after 50% expansion of said base material is 80 to 100%.

* * * * *